(12) United States Patent
Therrien et al.

(10) Patent No.: US 8,609,323 B2
(45) Date of Patent: Dec. 17, 2013

(54) SYSTEM FOR PRODUCING PATTERNED SILICON CARBIDE STRUCTURES

(75) Inventors: Joel M. Therrien, Westford, MA (US); Daniel F. Schmidt, Tewksbury, MA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 13/483,889

(22) Filed: May 30, 2012

(65) Prior Publication Data

US 2012/0321854 A1     Dec. 20, 2012

Related U.S. Application Data

(63) Continuation-in-part of application No. PCT/US2010/058575, filed on Dec. 1, 2010.

(60) Provisional application No. 61/265,582, filed on Dec. 1, 2009.

(51) Int. Cl.
*G03C 5/00* (2006.01)

(52) U.S. Cl.
USPC ........... 430/296; 430/311; 430/313; 430/314; 430/315; 430/316; 430/322; 430/323; 430/324; 430/325; 430/326; 430/942

(58) Field of Classification Search
USPC ......... 430/296, 311, 313, 314, 315, 316, 322, 430/323, 324, 325, 326, 942
See application file for complete search history.

(56) References Cited

U.S. PATENT DOCUMENTS

| | | | |
|---|---|---|---|
| 3,421,956 | A | 1/1969 | Ebert et al. |
| 4,855,254 | A | 8/1989 | Eshita et al. |
| 5,225,032 | A | 7/1993 | Golecki |
| 5,234,537 | A | 8/1993 | Nagano et al. |
| 5,349,207 | A | 9/1994 | Malhi |
| 5,759,908 | A | 6/1998 | Steckl et al. |
| 6,034,001 | A | 3/2000 | Shor et al. |
| 6,245,849 | B1 | 6/2001 | Morales et al. |
| 6,328,796 | B1 | 12/2001 | Kub et al. |
| 7,288,013 | B2 | 10/2007 | Yokoyama et al. |
| 2008/0070010 | A1 | 3/2008 | Dravid et al. |

FOREIGN PATENT DOCUMENTS

| | | |
|---|---|---|
| JP | 2001-048656 A | 2/2001 |
| KR | 10-2001-0012053 | 2/2001 |
| KR | 10-0836872 B1 | 1/2008 |

OTHER PUBLICATIONS http://www.starfiresystems.com/docs/cvd-precursors/CVD-4000.pdf.

http://www.starfiresystems.com/docs/ceramic-forming-polymers/SMP-10.pdf.

Lee, H.J., et al., "Nano-sized patterns derived from a SiCN preceramic polymer: Fabrication and their characterization," *J. Phys. Chem. Sol.*, 69(8): 2131-2136 (2008).

Li, Y.H., et al., "Chemical Development of Preceramic Polyvinylsilazane Photoresist for Ceramic Patterning," *J. Electroceramics*, 23(2-4): 133-136 (2009).

PCT Application No. PCT/US2010/058575: Notification Concerning Transmittal of International Preliminary Report on Patentability mailed on Jun. 14, 2012.

Pitcher, M.W., et al., "Smooth Continuous Films of Stoichiometric Silicon Carbide from Poly(methylsilyne)," *Adv. Mater.*, 16(8): 706-709 (2004).

Zhang, K., et al., "Fabrication of β-SiC Micropatterns from a Facile Replication Process," *J. Cer. Soc. Japan*, 119(5): 362-366 (2011).

Bachman, M., "RCA-1 Silicon Wafer Cleaning," U. I. N. R. Facility (1999).

http://www.kioncorp.com/productlist/polyureasilazane_20.html.

International Search Report and the Written Opinion on the International Searching Authority mailed on Aug. 20, 2011 from International Application No. PCT/US2010/058575 filed Dec. 1, 2010.

Kimoto, T., et al., "Aluminum and Boron Ion Implantations into 6H-SiC Epilayers," *J. Electron. Mater.*, 25 (5): 879-884 (1996).

Macdonald, L., "Facile Fabrication of SiC Matrix Composites Using Novel Preceramic Polymers," Ceram. Trans., 144: 87-95 (2002).

Roewer, G., et al., "Silicon Carbide—A Survey of Synthetic Approaches, Properties and Applications," *Structure and Bonding*, 101: 59-135 (2002).

Lee, R., "Carbosilanes: Reactions & Mechanisms of SMP-10 Pre-Ceramic Polymers," Marshall Space Flight Center, Jacobs ESTS Group/ICRC, Jul. 2009 (23 pages).

*Primary Examiner* — Christopher Young
(74) *Attorney, Agent, or Firm* — Hamilton, Brook, Smith & Reynolds, P.C.

(57) ABSTRACT

A method of forming ceramic pattern structures of silicon carbide film includes depositing an electron-beam resist or a photo-resist onto a substrate. A portion of the resist is selectively removed from the substrate to form a resist pattern on the substrate. A film of pre-ceramic polymer that includes silicon and carbon is deposited onto the substrate and resist pattern and the pre-ceramic polymer film is cured. A portion of the cured pre-ceramic polymer film on the resist pattern is removed, thereby forming a pre-ceramic polymer pattern on the substrate. The pre-ceramic polymer pattern is then converted to a ceramic pattern.

15 Claims, 4 Drawing Sheets
(1 of 4 Drawing Sheet(s) Filed in Color)

SYSTEM FOR PRODUCING PATTERNED SILICON CARBIDE STRUCTURES

RELATED APPLICATION

This application is a continuation-in-part of International Application No. PCT/US2010/058575, filed on Dec. 1, 2010, published in English, which claims the benefit of U.S. Provisional Application No. 61/265,582, filed on Dec. 1, 2009. The entire teachings of the above applications are incorporated herein by reference.

GOVERNMENT SUPPORT

This invention was made, in whole or in part, with government support under ECCS-0840672 and ECCS-0901814 awarded by the National Science Foundation. The United States Government has certain rights in the invention.

BACKGROUND OF THE INVENTION

Silicon Carbide (SiC) has been a material of interest for microelectronics for a considerable time. The large bandgap and chemical stability enables it to operate in environments where silicon can not function. Silicon electronics cease to function properly if the operating temperature exceeds 350° C. whereas SiC based devices have been shown to operate at temperatures as high as 650° C. The chemical inertness of SiC has generated interest in applications for chemical and biological sensors. Current uses for SiC based electronics largely focus on power applications where the high dielectric breakdown strength and temperature characteristics make it stand out. Applications in non-power applications have been sporadic with the most notable being their use in high frequency transistors, resulting in higher mobility and higher power density, for military applications and as the original blue LED, nearly a decade before indium nitride came on the scene.

Many advanced microelectronic devices require the removal of surrounding materials from the planar substrate surface. Field effect transistors based on the wrap around gate design require the channel to be exposed to the gate not only on the top but also on the sides, leading to lower off state leakage current. For example, Micro- and Nano-Electro Mechanical Systems (MEMS and NEMS respectively) require structures that are detached from the substrate to form moving mechanical components. In addition, SiC has promising optical properties in the mid infrared band and could potentially serve as a waveguide in that frequency range. These applications all require the ability to form structures with well defined edges.

One of the impediments to the wider use of SiC is the difficulties involved in etching to produce devices. The most common wet etching technique uses molten potassium hydroxide, at a temperature of ~400° C. This is highly undesirable for several reasons. The presence of potassium would require stringent isolation from any silicon process line. Potassium, along with the other alkali metals are well know for diffusing into silicon and creating what are known as deep level charge traps. These traps degrade the performance of any advanced digital circuit. In addition, the etching process requires a mask that is chemically resistant to the etchant yet be easily removed after the etch. In the case of molten potassium hydroxide, the choice of mask material is reduced to the noble metals or carbon, none of which makes for a practical material. The chemical stability of SiC has precluded any reasonable wet etching option, leaving the more expensive options of dry etching via reactive ion etching and inductively coupled plasma etching.

SUMMARY OF THE INVENTION

The invention is directed to a method of forming a patterned ceramic structures. According to one method, an electron-beam resist or a photo-resist is deposited onto a substrate. The resist is selectively exposed to an electron beam or radiation to thereby degrade, volatilize, polymerize, crosslink, or otherwise alter the solubility of a portion of the resist. Then, only the exposed or only the unexposed portion of the resist is removed from the substrate to form a resist pattern on the substrate. A structure, such as a film, of pre-ceramic polymer that includes silicon and carbon is deposited onto the substrate and resist pattern and the pre-ceramic polymer film of structure is cured. The resist pattern and a portion of the cured pre-ceramic polymer film or structure on the resist pattern are removed, thereby forming a pre-ceramic polymer pattern on the substrate. Finally, the pre-ceramic polymer pattern is converted to a ceramic pattern.

In another aspect, the invention is directed to a method of forming a patterned ceramic structures, such as a film, that includes preparing a mold comprising cavities having the shape of a desired structure. The mold is placed against a surface of a substrate on which the desired structure is to be formed. A pre-ceramic polymer is introduced into the mold. The pre-ceramic polymer is then cured and the mold is removed from the substrate, thereby forming a pre-ceramic polymer pattern on the substrate. Finally, the pre-ceramic polymer pattern is converted to a ceramic pattern.

The invention also includes patterned ceramic structures formed by the methods of the invention.

For SiC to gain wider acceptance, the processing technology utilized should be as compatible with what is used for silicon as possible. We have developed a method for creating patterned structures, such as thin films, of SiC using a process that involves lithography and thermal treatment. The chemicals used do not present any additional risk to silicon process lines for introduction of contaminants. The patterning is able to use the exact same exposure systems as are currently used. Finally, the thermal processing for forming the structures is well within the temperature range used in silicon wafer processing. Fundamentally, the key advantage to these features is that adoption of this technique can capitalize on the immense expenditures on the development of the silicon process technologies. It also does not need the construction of isolated processing facilities to avoid contamination of silicon lines.

This invention has many advantages. For example, very thin films, wherein the silicon carbide layer is essentially transparent, can be formed. This is indicative of very high purity semiconductor grade silicon carbide. Furthermore, features as small as 50 nanometers can be formed. The silicon carbide structure formed by the method of the invention can be employed to fabricate nanowire transistors, electrical components having chemical and biological sensor applications and field effect transistors.

BRIEF DESCRIPTION OF THE DRAWINGS

The patent or application file contains at least one drawing executed in color. Copies of this patent or patent application publication with color drawings will be provided by the Office upon request and payment of the necessary fee.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows. The teachings of all patents, published applications and references cited herein are incorporated by reference in their entirety.

In one aspect, the invention is directed to methods of producing patterned structures, such as films, of silicon carbide, such as films of silicon carbide. Patterned structures can be made with feature sizes down to 50 nm. The methods for making patterned silicon carbide in accordance with the present invention include the formation of the desired pattern in the pre-ceramic polymer first, and then subsequent conversion to SiC.

In one embodiment, the method includes depositing an electron beam resist or a photo-resist onto a substrate, and selectively exposing the resist to an electron beam or radiation to thereby degrade, volatilize, polymerize, crosslink, or otherwise alter the solubility of a portion of the resist. An electron-beam resist, such as poly(methylmethacrylate) (PMMA), or a suitable photo-resist, such as a blend of diazonaphthaquinone (DNQ) and Novolac (a phenol formaldehyde resin), or poly methyl glutarimide (PMGI) is deposited in a film onto a substrate. A "photo-resist," as that term is employed herein, means a film-forming solid that is sensitive to electromagnetic radiation, such as ultraviolet, infrared, x-ray and visible radiation, either alone or in the presence of sensitizers, with exposure to such radiation causing the resist to degrade, volatilize, polymerize, crosslink, or otherwise alter its solubility in those areas exposed.

Preferably, the electron-beam resist or photo-resist is dissolved or dispersed in a suitable liquid medium, such as a solvent (e.g., anisole). The liquid medium is allowed to evaporate, thereby leaving a resist film on the surface of the substrate. The uniformity of the film is achieved by selecting a liquid medium having a desired evaporation rate in order to maintain a desired thickness and uniformity of the resist layer.

Areas of the resist are then selectively exposed to an electron beam or radiation to thereby degrade, volatilize, polymerize, crosslink, or otherwise alter the solubility of a portion of the resist. In the case where the resist is degraded or becomes more soluble due to electron beam or radiation exposure ("positive tone"), the exposed portion is removed from the substrate to form a pattern of resist on the substrate. In the case where the resist is further polymerized/crosslinked or becomes less soluble due to electron beam or radiation exposure ("negative tone"), the unexposed portion is removed from the substrate to form a pattern of resist on the substrate. After exposure, a resist pattern is formed on the substrate by removing either only the exposed portion or unexposed portion of the resist.

A film or structure of pre-ceramic polymer that includes silicon and carbon is then deposited, for example, by spin coating, onto the substrate and resist pattern. The pre-ceramic polymer may be diluted in a liquid medium to facilitate deposition. In the case of spin coating, the uniformity of the resulting pre-ceramic polymer depends on the viscosity of the pre-ceramic polymer and the evaporation rate of the liquid medium. Alternatively, the pre-ceramic is deposited by placing the substrate under a solvent thinned polymer solution with a known polymer concentration and specific liquid height above the substrate. Evaporation of the liquid medium leads to a uniform film deposited on the substrate. As with the application of the resist film, the uniformity of the pre-ceramic polymer is achieved by selecting a solvent having a desired evaporation rate. For example, xylene, having an evaporation rate of 0.6 (based on a baseline of butyl acetate=1) and cyclohexane, having an evaporation rate of 5.5 have been found to produced films of desired uniformity.

Certain SiC precursor polymers having an exact 1:1 molar ratio of silicon to carbon in particular are especially well-suited to produce semiconductor-grade SiC. While numerous SiC precursors exist, it is very rare to find materials containing an exact 1:1 molar ratio of silicon to carbon. This is problematic because any deviation from a 1:1 stoichiometry results in a substantial defect concentration, most commonly producing the familiar black appearance of silicon carbide most are used to (due to excess carbon) and making the material effectively unusable as a semiconductor.

One suitable SiC precursor polymer Starfire SMP-10 (Starfire Systems), is primarily poly(silaethylene), a.k.a. poly(silylenemethylene), which is effectively identical to polyethylene but with every other carbon replaced with a silicon atom. This material has two distinct advantages; first, it contains a 1:1 molar ratio of silicon to carbon. Second, all bonds within a linear poly(silylenemethylene) are silicon-carbon bonds. This is important because even with perfect stoichiometry, the possibility to form defects does not disappear; if atoms of the same type cluster, this again results in defects that may critically degrade electronic performance. In this case, there is no need to break and reform bonds to arrive at the desired result of having every silicon atom bonded only to carbon atoms and vice-versa. This is in contrast to a polymers like poly(hydromethylsilane), a polymer that shares with poly (silylenemethylene) a 1:1 molar ratio of silicon to carbon but whose backbone contains only Si—Si bonds, all of which must be broken in order to form pure, defect-free silicon carbide. Thus, a silicon carbide precursor having a 1:1 molar ratio of silicon to carbon and having a backbone structure where the majority of bonds present are Si—C is recommended.

The pre-ceramic polymer used is primarily poly(silaethylene), a.k.a. poly(silylene methylene), and is available as SMP-10 from Starfire Technologies (*Ceram. Trans.* 144 87 (2002)). The composition and structure of linear chains of this type of polycarbosilane (described by the formula —[SiH$_2$CH$_2$]$_n$—) strongly favor the formation of stoichiometric silicon carbide, rather than silicon- or carbon-rich materials whose electronic properties would be of limited utility (*Struct. Bond.* 101 59 (2002)). For the same reasons this material represents an especially efficient precursor, with quoted ceramic yields of 75-82%, nearly as high as the theoretical yield of ~91% based on composition alone. While in its neat form this polymer is too viscous to achieve a uniform structure by spin coating, dilution with an appropriate liquid medium was identified as a useful strategy for spin-coating this material. The selection of the liquid medium was dependent on several factors. Most importantly, the liquid medium should not dissolve the resist, or the patterns made during lithography will be damaged. Second, it should be sufficiently volatile to produce a more or less liquid medium-free film following coating, but without being so volatile as to hinder film formation through rapid viscosity increases during spinning. It was also important to consider a liquid medium that would not chemically alter the polymer, nor leave any residue behind that might contaminate the converted ceramic—in particular, by increasing the carbon content. Dissolving the SMP-10 in cyclohexane at a 4:1 ratio of liquid medium to polymer or greater generally yields uniform structures sufficiently free of liquid medium to produce transparent SiC upon pyrolysis.

The ability of the pre-ceramic polymer to adhere to the silicon surface following deposition and conversion highlights another advantage of this technique. It is known that Si—H groups in this polymer will, in the presence of water, slowly oxidize to produce Si—OH groups, which may then react with one another to create siloxane crosslinks. Likewise, several dehydrogenative coupling reactions are also possible, including Si—H reacting with Si—OH or C—H bonds to form siloxane or carbosilane linkages. As Si—OH and/or Si—H bonds are generally present on the surface of silicon wafers (with exact type and number dependent on process history), the ability of the pre-ceramic polymer to form covalent bonds with the substrate is evident. In our case in particular, the modified RCA cleaning process employed ensures that a large concentration of Si—OH groups is present on the surface, favoring good adhesion.

Dopant atoms may be inserted into pre-ceramic polymer material while it is still in its polymeric form. Of particular interest are other pre-ceramic polymers/liquid precursors containing atoms, the majority of which are electron rich vs. SiC (n-type) or electron-poor vs. SiC (p-type) and whose crosslinking and subsequent thermal conversion (typically under inert atmosphere) lead to a doped semiconductor (as opposed to oxygen, for instance, which, while electron rich vs. SiC, will lead to the formation of an insulator). Polysilazanes are excellent n-type dopants, given their established utility as precursors for silicon nitride. The addition of a small amount of polysilazane allows formation of N-doped (n-type) SiC with minimal addition of excess carbon, which is always a concern from the point of view of electronic properties. In particular polysilazanes have been identified which are not only miscible with standard SiC precursor polymers at the needed doping levels, but which will react with the SiC precursor polymers on the molecular level, producing a homogeneous pre-ceramic polymer network with the dopant atoms "built-in". Such a mixture may then be processed in an identical fashion to the pure SiC precursor polymer, making this an exceptionally convenient approach to doping. In addition to this, more traditional techniques may also be used; for instance, while boranes and other oxygen-free liquid organoboron compounds tend to be pyrophoric/unstable, making the aforementioned approach less attractive (though still possible), the ion-implantation of boron (B) and aluminum (Al) into SiC films has been demonstrated in the research literature and represents a straightforward means of achieving p-type doping (see *J. Electron. Mater.* 25 879-884 (1996), for example, the teachings of which are incorporated herein by reference). Another possibility is inclusion of elemental compounds directly; for instance, in the case of p-type dopants, boron nanopowder or liquid gallium metal may be physically mixed into the SiC precursor polymer prior to conversion. A third approach to doping in general involves the use of gases containing only the dopant atom in question and fugitive atoms that are readily removed via heat treatment (hydrogen, for instance). In this scenario, the precursor polymer might be exposed to an atmosphere containing some amount of diborane, dialane, digallane, ammonia, phosphine or arsine vapor, to give several examples, prior to and/or during the conversion process, with the reactive nature of these gases causing the inclusion of the desired dopants (B, Al, Ga, N, P or Ar in the examples given) into the precursor polymer.

After application of the pre-ceramic polymer, a portion of the polymer is removed thereby forming a pre-ceramic polymer pattern on the substrate. A suitable solvent for dissolving the resist pattern without substantially attacking the pre-ceramic polymer is introduced. As the resist is washed away, the cured pre-ceramic polymer sitting atop the resist will lose its only means of support and will be removed as well, leaving behind the cured pre-ceramic polymer that is directly bonded to the substrate.

Photoresists may contain non-volatile materials which would result in the deposition of ash or other unwanted substances on the substrate. If a resist is used that produces such interfering residue as a result of thermal degradation, the pre-ceramic polymer is first cured, and the resist is removed with a suitable solvent, such as acetone or a resist stripper, such as N-methyl-2-pyrrolidone, that is specifically selected to be aggressive towards the remaining resist while leaving the cured pre-ceramic polymer phase adhered and substantially intact.

The pre-ceramic polymer pattern is next converted to a ceramic pattern, for example, by placing the substrate into a furnace filled with inert gas and heat to a specified temperature at which the polymer undergoes a chemical conversion to the "ceramic" form. Any remaining resist is depolymerized or otherwise decomposed to volatile species without the production of residues detrimental to the subsequent applications of the material. While this is typically performed in an inert atmosphere in order to ensure that no elements other than those already present in the cured pre-ceramic polymer are incorporated into a final ceramic, it should be recognized that further modifications to the composition and properties of the final ceramic may be readily achieved through the intentional introduction of reactive species into the atmosphere of the furnace either throughout the process or at specific points during the process, as noted previously.

Figure 1:
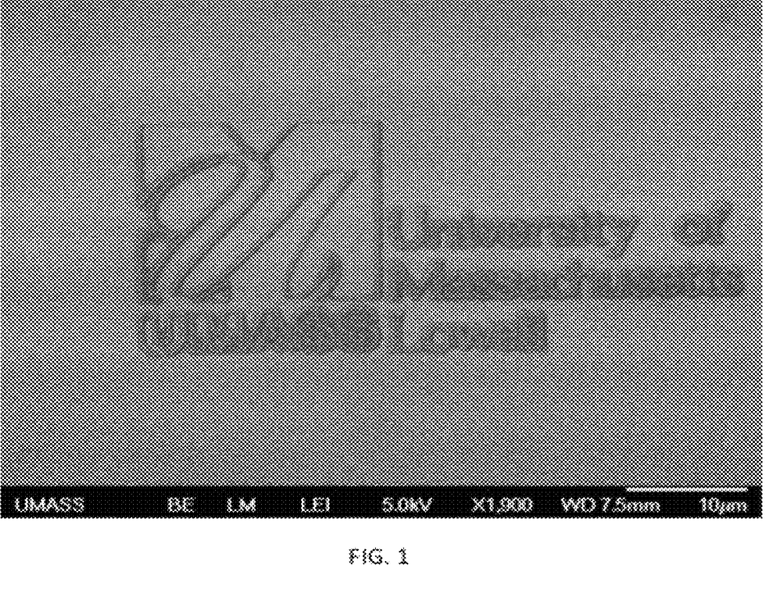
FIG. 1 is a SEM image of patterned SiC according to the present invention

Any pre-ceramic polymer not in contact with the substrate is lifted off, leaving behind a pattern of SiC (FIG. 1). During the conversion process, the remaining electron-beam resist or photo-resist volatilizes without leaving residue on the substrate. The end result is a film of the SiC wherever the pattern was made in the PMMA. By this method, electron-beam or photo-lithography structures can be made with feature sizes down to 50 nm.

The reported technique has been demonstrated to have the capability to form structures with well defined edges and feature sizes comparable to the current generation of commercial microelectronic devices. The limitations on structure size are on the electron beam exposure system. There is no indication from the analysis that the reported resolution represents the ultimate limit for the resolution of the SiC patterning. The polymer employed contains no alkali metals, nor any other element that would be considered a contaminant for silicon processing. The fabrication process employs, photoresist patterning via electron beam- and photo-lithography, spin coating, and thermal treatment in an inert atmosphere.

Each of these steps is an integral part of the production of any microelectronic device, thus guaranteeing compatibility with silicon foundries.

Patterning the SiC films by the method of the invention avoids the significant issues that are normally faced when processing SiC. Typically, if the SiC needs to be etched to form structures, it is either done with molten potassium hydroxide at ~400° C. or via reactive ion etching. The former is a difficult material to handle and requires conditions far beyond what the semiconductor industry employs for silicon etching. Reactive ion etching is common in industry, but it is expensive and is used as minimally as possible. The method of the invention can readily be implemented into a standard silicon fabrication line; there are no chemicals, temperatures, or special processing requirements that exceed what is in common use today.

Alternatively, patterned structures can also be formed by preparing a mold comprising cavities having the shape of a desired structure. The mold is placed against a surface of a substrate on which the desired structure is to be formed. A pre-ceramic polymer is introduced into the mold. The pre-ceramic polymer is then cured and the mold is removed from the substrate, thereby forming a pre-ceramic polymer pattern on the substrate. Finally, the pre-ceramic polymer pattern is converted to a ceramic pattern. Any of the standard tooling used in polymer molding, such as metal, silicon, and/or heat resistant polymers, can be used to form the mold. For example, a patterned silicone rubber stamp can be used to stamp the liquid pre-ceramic polymer onto a substrate. In another embodiment, the stamp is pressed onto a substrate coated with a film of the liquid pre-ceramic polymer, thereby displacing the polymer out of the areas of contact between the stamp and the substrate and forming a pre-ceramic polymer pattern. Such methods, when employing elastomeric stamps, are often referred to as "soft lithography." Regardless of the type of tooling used, the mold must have sufficient resolution and good release characteristics, which may be achieved either through selection of the tooling material itself or subsequent treatment of the tooling with reactive or inert species designed to enhance mold release. Alternatively, the pre-ceramic can be molded in the absence of a substrate.

The structures of the invention are what would be considered epitaxial in that the substrate crystal structure plays a central role in the formation of the structure of the film. The above-mentioned SiC films are fabricated on a single crystal silicon substrate with a <100> crystal orientation, the SiC forms a single crystal across the entire substrate. Analysis of the structures has indicated that it taking on a diamond cubic structure, known as β-SiC. Use of an amorphous substrate did not show evidence of single crystal formation, but rather the formation of polycrystalline domains on the order of 100 μm. The sample sizes are as large as 2 cm, though this should not be interpreted as a limitation of the approach.

The epitaxial process of the present invention has at least two distinct advantages. First, it can be used with the above patterning process. Also, it is able to form single crystal β-SiC without the use of chemical vapor deposition. Further, the spin coating process employed by the method of the invention offers a distinct cost advantage. Any phase of SiC can be formed, depending on the substrate. Alternatively, the material can be amorphous; the method is not exclusive to a particular phase of SiC

EXAMPLES

For these experiments, electron beam lithography was used to form arrays of nanowires as well as more complicated patterns. PMMA was spin coated on silicon substrates to a thickness of 200 nm. The patterns were created using a JEOL JSM 1401F field emission scanning electron microscope (SEM) using the NPGS nanopatterning system. Following electron beam exposure, the resist was developed in a 3:1 mixture of isopropyl alcohol and methyl isobutyl ketone (MIBK). This mixture produces the highest resolution patterns. Previous lithography tests with this SEM have shown a minimum pattern linewidth of 50 nm in 200 nm PMMA.

Figure 2:
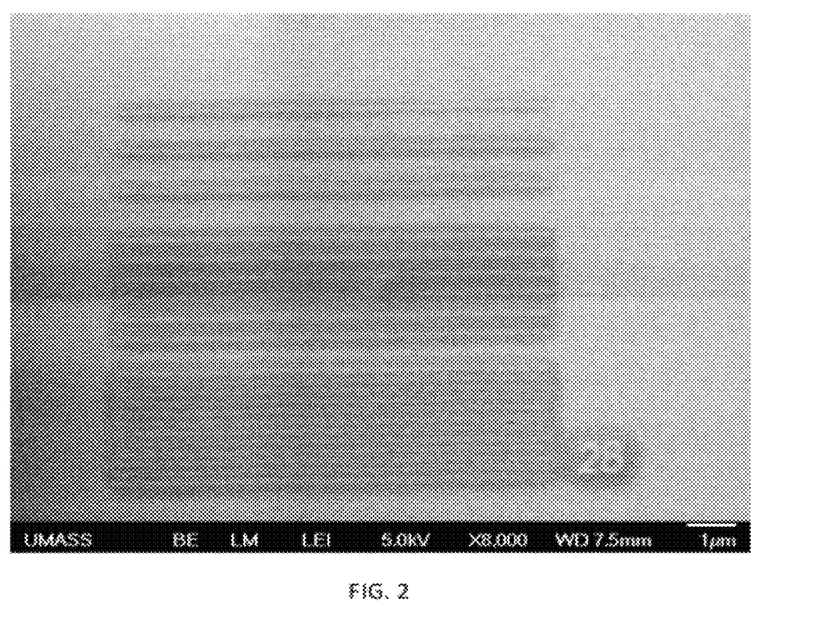
FIG. 2 is a SEM micrograph of SiC nanowires formed by polymer molding of PMMA patterned by e-beam lithography.
Figure 3:
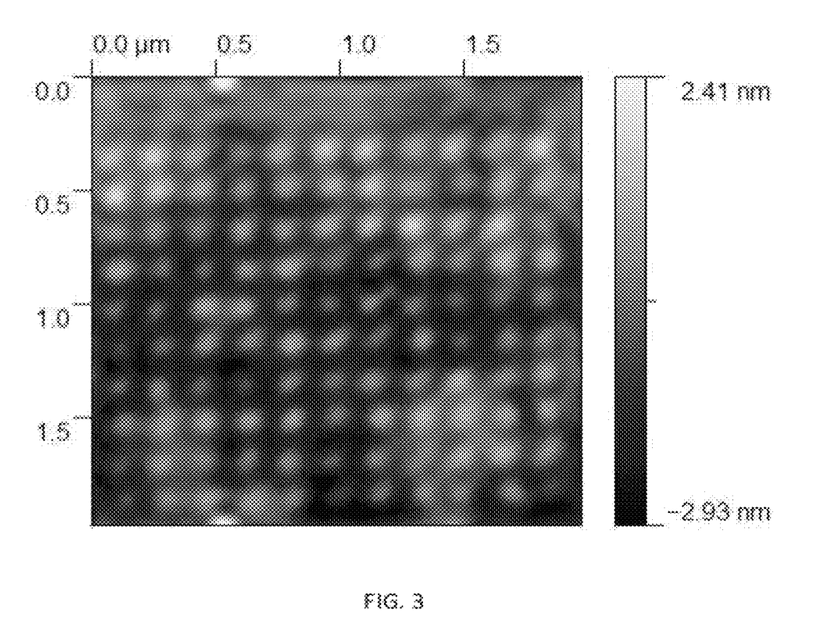
FIG. 3 is an AFM image of SiC nano-disks 100 nm in diameter and 4 nm thick formed by polymer molding of PMMA patterned by e-beam lithography.

Patterns that were tested consisted of arrays of lines and dots with widths/diameters ranging from 50 nm to 500 nm. Several complex patterns with numerous curved shapes, such as the University of Massachusetts Lowell logo were also tried (FIG. 1). To assess the ability to form large areas with a uniform SiC film, a pattern with a width of 20 μm and a length of 100 μm was made as well. The line and dot patterns were measured with SEM (FIG. 2) as well as atomic force microscopy (AFM) (FIG. 3). It was found that the process was capable of forming structures with line widths at the minimum that the electron beam lithography was capable of creating, 50 nm.

500 μm thick <100> prime grade silicon wafers from University Wafer were cleaned using an abbreviated form of the standard 'RCA' [a] cleaning procedure, which is incorporated herein in its entirety. In particular, the first step was employed: Cleaning in a mixture of $NH_4OH$ and $H_2O_2$. This was followed by successive rinsing in microelectronics grade acetone, isopropyl alcohol, and deionized water. These steps removed any organic contaminants present on the wafer surface, and ensured good adhesion of the pre-ceramic polymer following deposition and pyrolysis.

As the viscosity of pure SMP-10 was found to be too high to form homogeneous films via spin coating, diluted SMP-10 was favored following several experiments which showed higher concentration of solvent produces better SiC upon pyrolysis. Several solvents were investigated for this process as well, including xylenes, cyclohexane and methylcyclohexane. Solutions based on xylenes were found to evaporate at an appropriate rate for the formation of homogeneous films, but dissolved the PMMA to a large extent. This favored the selection of cycloaliphatic hydrocarbons with similar volatility to xylenes and the ability to dissolve SMP-10 without dissolving PMMA or photoresists. In the finalized procedures, SMP-10 was dissolved in cyclohexane at a 1:19 ratio of polymer to solvent by weight (5 wt % SMP-10).

A 2 wt % solution (in anisole) of PMMA with a molecular weight of 950,000 g $mol^{-1}$ was purchased from MicroChem. 500 μL of this PMMA solution was applied to a silicon substrate using a positive displacement microdispenser while the latter was spun at a speed of 600 rpm for 60 seconds using a CHEMAT KW-4A spin coater. The coated sample was then put on a temperature-controlled hot plate ($T_{surface}$=180° C.) for 15 minutes. Then, a pattern was created on the sample using the NPGS nanopatterning system of a JEOL JSM-1401F field emission scanning electron microscope (FE-SEM). Finally, the PMMA was developed in a 1:3 mixture of microelectronics grade methyl isobutyl ketone and isopropyl alcohol.

Patterning has also been demonstrated using a UV based photoresist (AZ1512 from AZ electronic materials). The AZ1512 was applied to the substrate at 4000 RPM for 45 seconds. The freshly coated substrate was baked at 90° C. for 45 seconds. A chrome plated exposure mask with the desired pattern to be transferred was placed on top of the substrate. The substrate was then placed under a Hg flood lamp with an electronically timed shutter. Exposures lasted from 15-45 seconds depending on the thickness of the resist used. Following exposure, the substrate was placed in AZ 300 MIF Developer (AZ electronic materials) for approximately 40 seconds, followed by a rinse in deionized water.

500 μL of 5 wt % SMP-10 dissolved in cyclohexane was applied to the substrate while the latter was spun at a speed of 4000 rpm for 60 seconds. After spin-coating, the homogeneous pre-ceramic polymer film thus formed was ready for high temperature conversion to silicon carbide directly in the case of PMMA resists. For the AZ1512 resist, the substrate was placed in a vacuum oven and cured under a nitrogen atmosphere for 3 hours at 120° C. Following curing, the resist was removed via dissolution in acetone.

To avoid stress induced fracturing of the SiC film induced by rapid increases in temperature, a series of stages of gradual heating are required to yield intact structures. The pyrolysis step, following the thermal profile detailed in Table 1, was carried out in a Lindberg 54233 tube furnace using an alumina tube with sealed, gas-ported end-caps under flowing argon (60 mL min$^{-1}$), as needed to prevent oxide formation.

TABLE 1

Temperature profile for pyrolysis of the pre-ceramic polymer into SiC.

| Step | Ramp time [min] | Soak time [min] | Soak Temperature [° C.] |
|---|---|---|---|
| 1 | 220 | 0 | 250 |
| 2 | 400 | 0 | 650 |
| 3 | 66 | 60-360 | 800 |
| 4 | 360 | 0 | 30 |

Figure 4:
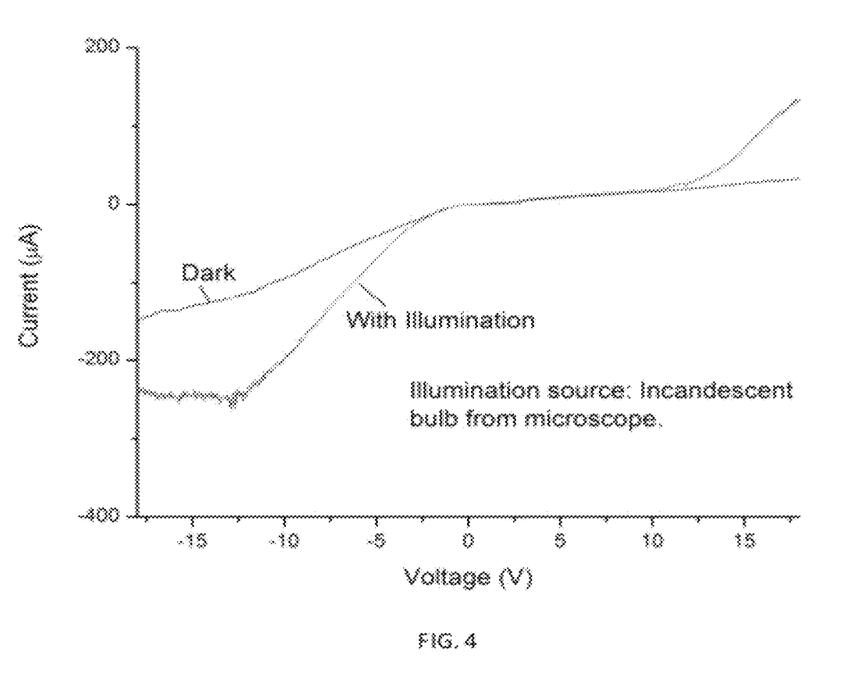
FIG. 4 is a graph of current vs. voltage curves for undoped SiC films, with and without illumination with visible light.

We used photoconductivity tests with a visible light source to demonstrate that the resulting SiC is of semiconducting quality (if it were impure, the conductivity would not be so affected by illumination). Illumination creates free electron hole pairs which contribute to conductivity in the semiconductor. This effect would not be observed in metals or insulators via the application of visible light as it requires an interband transition to occur. FIG. 4 shows current vs. voltage curves for undoped SiC films, with and without illumination with visible light.

Figure 5:
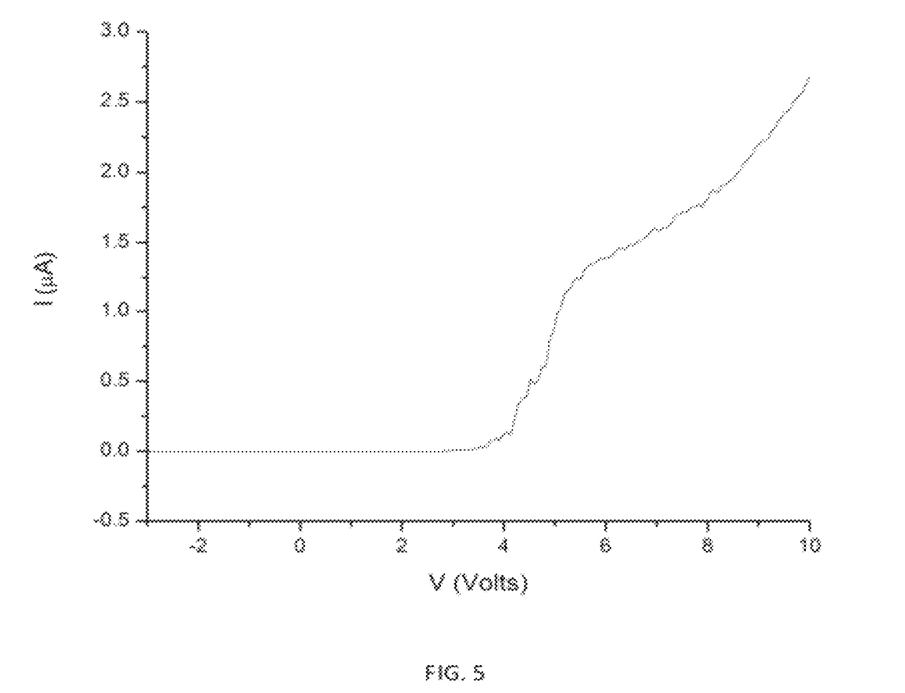
FIG. 5 is a graph of a current-voltage curve for a Si—SiC heterojunction diode.
Figure 6:
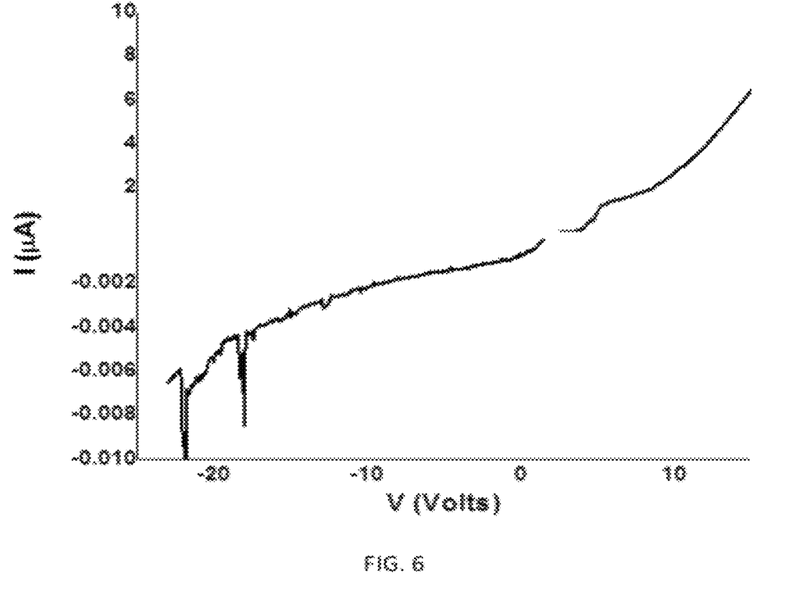
FIG. 6 is a graph of a current-voltage curve for a Si—SiC heterojunction diode.

We also demonstrated the fabrication of a silicon-silicon carbide heterojunction diode. The pre-ceramic polymer in this case is doped with nitrogen by ion implantation and is in contact with a phosphorous doped p-type silicon substrate. Current vs. voltage curves across the junction show a clear rectification effect, with current in the forward bias direction three orders of magnitude larger than in reverse bias. The orientation of the polarities correctly corresponds with the expected anode and cathode terminals for the diode. Without doping of the SiC, no rectification is observed and the current through the device is on the order of nanoamps.

Current-voltage curves for Si—SiC heterojunction diode. The devices shows a turn-on voltage of approximately 4 V, consistent with a SiC device as shown in FIG. 5 (a silicon diode turns on around 0.5-0.7 V). FIG. 6 indicates that the diode shows excellent rectification with a reverse bias current that is three orders of magnitude smaller than the forward bias current.

Using this diode, we also demonstrated photoconductivity; with light applied to the diode under bias, an increased current is found to flow through the diode. This effect was demonstrated at elevated temperatures. Testing has been conducted up to 170° C. In contrast, silicon photosensors cease to work at temperatures above 100-150° C. The diode has also been shown to develop a photovoltage when exposed to sunlight, indicating that it can also act as a solar cell.

The teachings of all patents, including U.S. Pat. Nos. 5,234,537, 3,421,956 and 6,034,001, published applications and references cited herein are incorporated by reference in their entirety. All references identified also are incorporated herein by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A method of forming a ceramic pattern, comprising the steps of:
   a) depositing an electron-beam resist or a photo-resist onto a substrate;
   b) selectively exposing the resist to an electron beam or radiation to thereby degrade, volatilize, polymerize, crosslink, or otherwise alter the solubility of a portion of the resist;
   c) removing only the exposed or only the unexposed portion of the resist from the substrate to form a resist pattern on the substrate;
   d) depositing a pre-ceramic polymer that includes a poly (silaethylene) onto the substrate and resist pattern;
   e) removing a portion of the pre-ceramic polymer previously deposited on the resist pattern, thereby forming a pre-ceramic polymer pattern on the substrate, wherein the pre-ceramic polymer pattern has an average thickness in a range of between about 1 nanometer and 5 micrometers; and
   f) converting the pre-ceramic polymer pattern to a ceramic pattern.

2. The method of claim 1, wherein the resist and/or the pre-ceramic polymer is deposited onto the substrate by spin-coating.

3. The method of claim 1, wherein the electron-beam resist is poly(methyl methacrylate).

4. The method of claim 1, wherein the photo-resist includes at least one member selected from the group consisting of diazonaphthaquinone (DNQ) and polymethyl glutarimide (PMGI).

5. The method of claim 4, wherein the photo-resist includes DNQ, and further includes a phenol formaldehyde resin.

6. The method of claim 1, wherein the pre-ceramic polymer is cured prior to resist pattern removal, and the resist pattern is removed using a solvent that does not substantially degrade the cured pre-ceramic polymer.

7. The method of claim 1, wherein the thickness of the resist on the substrate is in a range of between about 1 nanometer and 5 micrometers.

8. The method of claim 1, wherein dopant atoms are inserted into the pre-ceramic polymer.

9. The method of claim 1, wherein the substrate, resist layer and pre-ceramic polymer are heated in an inert atmosphere, or one containing a reactive gas that effects doping of the resulting ceramic, during the step of converting the pre-ceramic polymer to a ceramic.

10. The method of claim 1, wherein the poly(silaethylene) pre-ceramic polymer is an allyl hydrido polycarbosilane.

11. A method of forming a ceramic structure, comprising the steps of:
   a) preparing a mold comprising cavities having the shape of a desired structure;

b) introducing a pre-ceramic polymer that includes a poly(silaethylene) into the mold;
c) curing the pre-ceramic polymer;
d) removing the mold from the pre-ceramic polymer, thereby forming a pre-ceramic polymer structure, wherein the pre-ceramic polymer structure has an average thickness in a range of between about 1 nanometer and 5 micrometers;
e) converting the pre-ceramic polymer structure to a ceramic structure.

12. The method of claim 11, wherein the mold is placed against a surface of a substrate on which the desired structure is to be formed.

13. The method of claim 11, wherein the poly(silaethylene) pre-ceramic polymer is an allyl hydrido polycarbosilane.

14. A patterned structure formed by the method of claim 1.

15. A patterned structure formed by the method of claim 11.

* * * * *